(12) United States Patent
Kim et al.

(10) Patent No.: US 11,444,208 B2
(45) Date of Patent: Sep. 13, 2022

(54) NON-VOLATILE MEMORY DEVICE HAVING LOW-K DIELECTRIC LAYER ON SIDEWALL OF CONTROL GATE ELECTRODE

(71) Applicant: INDUSTRY-UNIVERSITY COOPERATION FOUNDATION HANYANG UNIVERSITY, Seoul (KR)

(72) Inventors: Tae Whan Kim, Seoul (KR); Jun Gyu Lee, Daegu (KR); Hyun Soo Jung, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 122 days.

(21) Appl. No.: 16/794,715

(22) Filed: Feb. 19, 2020

(65) Prior Publication Data
US 2020/0274001 A1   Aug. 27, 2020

(30) Foreign Application Priority Data
Feb. 21, 2019   (KR) .................. 10-2019-0020431

(51) Int. Cl.
| | |
|---|---|
| *H01L 21/66* | (2006.01) |
| *H01L 29/792* | (2006.01) |
| *G11C 16/14* | (2006.01) |
| *H01L 29/423* | (2006.01) |
| *H01L 27/11565* | (2017.01) |

(52) U.S. Cl.
CPC .......... *H01L 29/7926* (2013.01); *G11C 16/14* (2013.01); *H01L 27/11565* (2013.01); *H01L 29/4234* (2013.01)

(58) Field of Classification Search
CPC ............. H01L 29/7926; H01L 29/4234; H01L 27/11565; G11C 16/14
See application file for complete search history.

(56) References Cited

U.S. PATENT DOCUMENTS

| | | | |
|---|---|---|---|
| 9,876,031 B1 * | 1/2018 | Shimizu | ............ H01L 29/42344 |
| 2015/0137326 A1 | 5/2015 | Kang et al. | |
| 2015/0194440 A1 | 7/2015 | Noh et al. | |
| 2016/0300848 A1 * | 10/2016 | Pachamuthu | ..... H01L 27/11582 |
| 2017/0148811 A1 * | 5/2017 | Zhang | ............... H01L 27/11519 |

FOREIGN PATENT DOCUMENTS

| | | |
|---|---|---|
| KR | 10-2015-0057787 A | 5/2015 |
| KR | 10-2015-0083319 A | 7/2015 |

* cited by examiner

*Primary Examiner* — Mohammad M Choudhry
(74) *Attorney, Agent, or Firm* — Sughrue Mion, PLLC

(57) ABSTRACT

A non-volatile memory device is provided. The non-volatile memory device comprises a semiconductor channel layer, a tunneling layer, a charge trap layer, and a blocking insulating layer arranged in sequence. A plurality of control gate electrodes are disposed on the blocking insulating layer. An inter-cell insulating layer is disposed between the control gate electrodes. A spacer insulating film is disposed between the control gate electrode and the inter-cell insulating layer, and the spacer insulating film has a lower dielectric constant than the inter-cell insulating layer. The charge trap layer extends under the plurality of control gate electrodes and is disposed under the inter-cell insulating layer and the spacer insulating film.

11 Claims, 7 Drawing Sheets

NON-VOLATILE MEMORY DEVICE HAVING LOW-K DIELECTRIC LAYER ON SIDEWALL OF CONTROL GATE ELECTRODE

CLAIM FOR PRIORITY

This application claims priority to Korean Patent Application No. 2019-0020431 filed on Feb. 21, 2019 in the Korean Intellectual Property Office (KIPO), the entire contents of which are hereby incorporated by reference.

BACKGROUND

1. Technical Field

Example embodiments of the present invention relates to a semiconductor device, and more specifically to a non-volatile memory device.

2. Related Art

The semiconductor memory device may be largely classified into a volatile semiconductor memory device and a non-volatile semiconductor memory device. Volatile semiconductor memory devices are fast to read and write, but the stored information can be lost when the power supply is cut off. On the other hand, the non-volatile semiconductor memory device retains data even when the power supply is interrupted. Therefore, the non-volatile semiconductor memory device is used to store data to be preserved regardless of whether power is supplied.

A typical example of a non-volatile memory device is a flash memory device. Flash memory devices are used as a storage medium for voice and video data of information devices such as computers, mobile phones, smartphones, digital cameras, camcorders, voice recorders, MP3 players, personal digital assistants (PDAs), portable computers, game machines, fax machines, scanners, printers, and so on. Recently, technologies for high capacity, high speed input/output, and low power of flash memory devices have been actively studied for mounting in mobile devices such as smart phones.

In recent years, as the demand for higher capacity for flash memory devices increases, vertical memory devices have been developed (KR 2014-0011872), and multi-level cells (MLCs) or multi-bit memory devices storing multi-bits in one memory cell have been developed.

SUMMARY

Example embodiments of the present invention provide a non-volatile memory device having improved threshold voltage window and data retention characteristics for implementing high capacity.

Example embodiments of the present invention provide a non-volatile memory device. The non-volatile memory device comprises a semiconductor channel layer, a tunneling layer, a charge trap layer, and a blocking insulating layer arranged in sequence. A plurality of control gate electrodes are disposed on the blocking insulating layer. An inter-cell insulating layer is disposed between the control gate electrodes. A spacer insulating film is disposed between the control gate electrode and the inter-cell insulating layer, and the spacer insulating film has a lower dielectric constant than the inter-cell insulating layer. The charge trap layer extends under the plurality of control gate electrodes and is disposed under the inter-cell insulating layer and the spacer insulating film.

The inter-cell insulating layer may be a silicon oxide layer. The spacer insulating film may be a silicon oxide-based low-k insulating film, an organic polymer film, or a silicone based polymeric layer. The silicon oxide-based low-k insulating film may be a fluorine-doped silicon oxide layer, a carbon-doped silicon oxide layer, a porous silicon oxide layer, or a porous carbon-doped silicon oxide layer. The organic polymer film may be polyimides, polynorbornenes, benzocyclobutene polymer, or PTFE (polytetrafluoroethylene). The silicone based polymeric layer may be HSQ (hydrogen silsesquioxane) or MSQ(methyl silsesquioxane).

The width of the spacer insulating film may be smaller than the width of the inter-cell insulating layer. A ratio of a width of the spacer insulating film to a spacing between the control gate patterns may be 0.05 to 0.2, specifically 0.1 to 0.15. The spacer insulating film may have a width of 2 to 8 nm, specifically 4 to 6 m.

Example embodiments of the present invention provide a vertical non-volatile memory device. The vertical non-volatile memory comprises a substrate and an insulating pillar extending in an upper direction of the substrate. Inter-cell insulating layers and control gate patterns are disposed on the side of the insulating pillar and alternately stacked. Spacer insulating films disposed between the respective control gate pattern and inter-cell insulating layers adjacent to upper and lower portions of the control gate pattern at the side of the insulating pillar and having a lower dielectric constant than the inter-cell insulating layers. A semiconductor channel layer, a tunneling layer, a charge trapping layer, and a blocking insulating layer sequentially disposed on the insulating pillar and extending along the insulating pillar between the insulating pillar and the control gate patterns.

The inter-cell insulating layer may be a silicon oxide layer. The spacer insulating film may be a silicon oxide-based low-k insulating film, an organic polymer film, or a silicone based polymeric layer. The width of the spacer insulating film may be smaller than the width of the inter-cell insulating layer. A ratio of a width of the spacer insulating film to a spacing between the control gate patterns may be 0.05 to 0.2, specifically 0.1 to 0.15. The spacer insulating film may have a width of 2 to 8 nm, specifically 4 to 6 nm.

BRIEF DESCRIPTION OF DRAWINGS

Example embodiments of the present invention will become more apparent by describing in detail example embodiments of the present invention with reference to the accompanying drawings, in which:

FIG. 3 is an enlarged cross-sectional view illustrating region A of FIG. 2D.

DESCRIPTION OF EXAMPLE EMBODIMENTS

Figure 1:
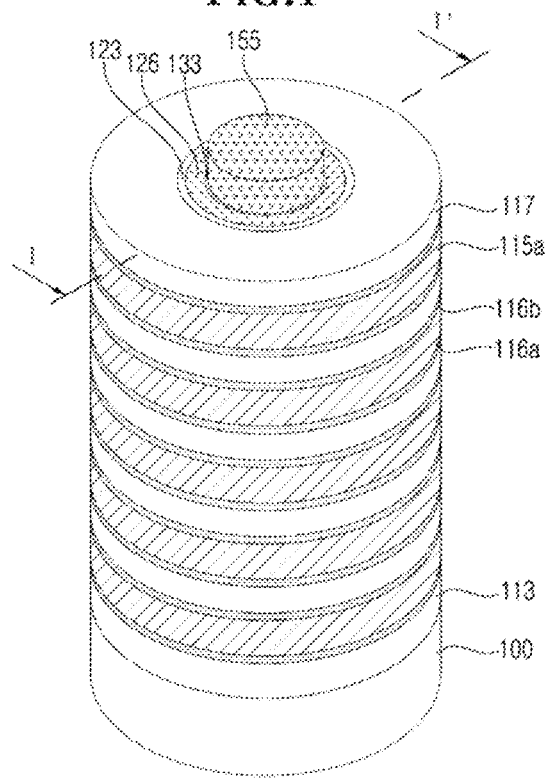
FIG. 1 is a perspective view illustrating a vertical non-volatile memory device according to an exemplary embodiment of the present invention.

Hereinafter, to more fully explain the present invention, embodiments according to the present invention will be described in further detail with reference to the accompanying drawings. However, the present invention may be embodied in different forms without limitation to the embodiments explained herein. Like reference numerals denote like elements throughout the specification. In the specification, the sentence "a first layer is disposed" on "a second layer" means that these layers are in direct contact with each other, and a third layer(s) is/are disposed between these layers. In the present embodiments, "first", "second", or "third" is not intended to impose any limitation on the components, but should be understood as a term for distinguishing the components.

FIG. 1 is a perspective view illustrating a vertical non-volatile memory device according to an exemplary embodiment of the present invention, and FIGS. 2A to 2D are cross-sectional views taken in sequential process steps based on the cutting line I-I' of FIG. 1. Specifically, FIG. 2D may correspond to a cross section taken along cutting line I-I' in FIG. 1.

Referring to 2A, a lower insulating layer 113 may be formed on a substrate 100. A stack S in which a plurality of control gate layers 115 and a plurality of inter-cell insulating layers 117 are alternately stacked may be formed on the lower insulating layer 113. In forming the stack S, a lower spacer insulating film 116a may be formed on the insulating layer 113 or 117 before the respective control gate layer 115 is formed, and an upper spacer insulating film 116b may be formed on the each control gate layer 115. Accordingly, the stack S may include n unit layers on the lower insulating layer 113, wherein, in each unit layer $L_n$, the lower spacer insulating film 116a, the control gate layer 115, the upper spacer insulating film 116b, and the inter-cell insulating layer 117 may be sequentially stacked.

The substrate 100 may be a semiconductor substrate, and may be, for example, a monocrystalline silicon substrate, a IV-IV compound substrate such as silicon-germanium or silicon carbide substrate, a III-V compound substrate, or a II-VI compound substrate; or a substrate in which a semiconductor layer such as a silicon layer, a IV-IV compound layer such as silicon-germanium or silicon carbide layer, a III-V compound layer, or a II-VI compound layer is formed on any kind of base substrate. The control gate layer 115 may include a semiconductor material, for example, a doped polysilicon; or a metal, for example, tungsten, copper, aluminum, tantalum, titanium, cobalt, titanium nitride or alloys thereof.

The spacer insulating film 116a or 116b may be an insulating layer having lower dielectric constant than the lower insulating layer 113 or the inter-cell insulating layer 117. The spacer insulating film 116a or 116b may be a low-k insulator having lower dielectric constant than silicon oxide such as $SiO_2$. For example, the spacer insulating film 116a or 116b may include a silicon oxide-based low dielectric constant insulating film, a low dielectric constant organic polymer film, or a low dielectric constant silicone-based polymer layer. The silicon oxide-based low dielectric constant insulating film may be a fluorine-doped silicon oxide layer ($\varepsilon$=3.9 to 3.5) such as F-doped $SiO_2$, a carbon-doped silicon oxide layer ($\varepsilon$=3.0) such as C-doped $SiO_2$, a porous silicon oxide layer such as porous $SiO_2$, or a porous carbon-doped silicon oxide layer such as porous carbon-doped $SiO_2$. The low dielectric constant organic polymer film may be polyimides, polynorbornenes, benzocyclobutene polymer, or PTFE (polytetrafluoroethylene). The low dielectric constant silicone-based polymer layer may be hydrogen silsesquioxane (HSQ) or methyl silsesquioxane (MSQ). The silicon oxide-based low dielectric constant insulating film can be formed using a method such as chemical vapor deposition (CVD) or atomic layer deposition (ALD). The low dielectric constant organic polymer film or the low dielectric constant silicone-based polymer layer may be formed using spin coating or the like. In example embodiments, the lower insulating layer 113 and the inter-cell insulating layer 117 may be silicon oxide layers.

Figure 2A:
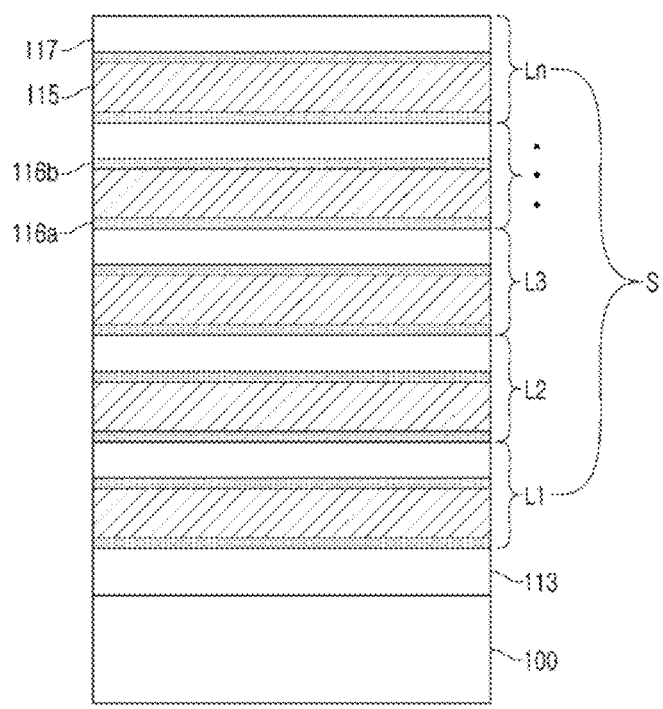
FIGS. 2A to 2D are cross-sectional views taken in sequential process steps based on the cutting line I-I' of FIG. 1.
Figure 2B:
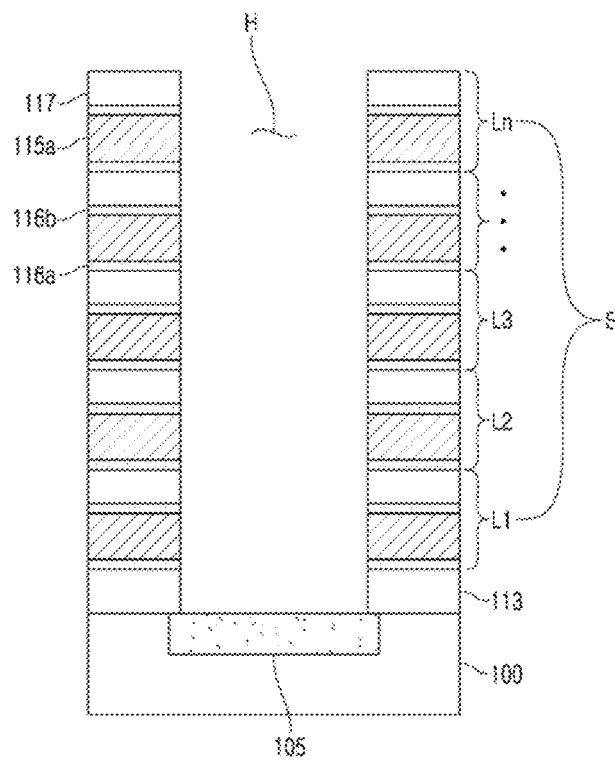

Referring to FIG. 2B, an opening H may be formed through the stack S in which the unit layers $L_n$ are stacked and the lower insulating layer 113 to expose the substrate 100) in the bottom surface of the opening H. In example embodiments, an impurity region 105 may be formed in the substrate 100 before forming the lower insulating layer 113 and the stack S, and then the opening H is formed to expose the impurity region 105. In another example, the impurity region 105 may be formed in the semiconductor substrate 100 exposed in the opening H by ion implantation or the like. The impurity region 105 may be a common source line.

Control gate patterns or control gate electrodes 115a may be defined by the formation of the opening H, and the control gate patterns 115a may be exposed in the sidewall of the opening H.

Figure 2C:
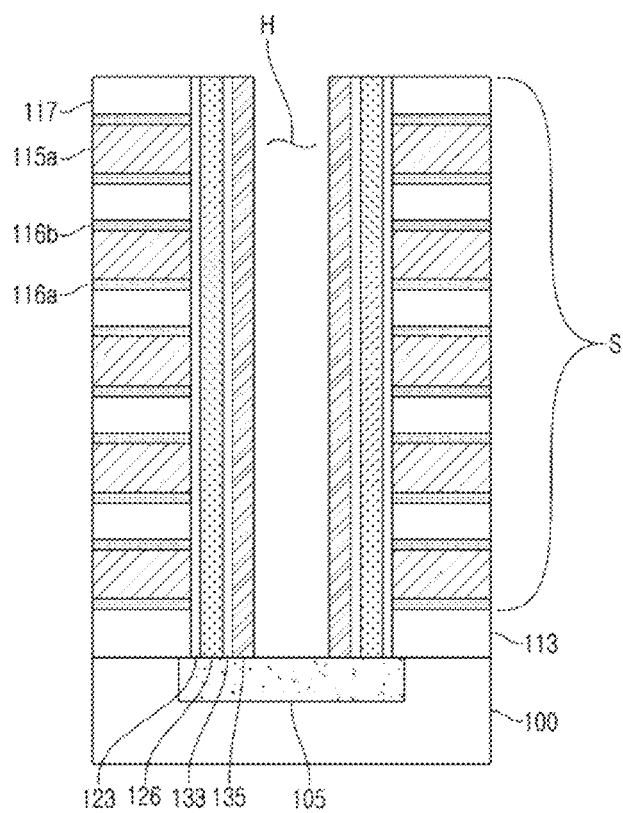

Referring to FIG. 2C, a blocking insulating layer 123, a charge trap layer 126, and a tunneling layer 133 sequentially stacked on the sidewalls of the opening H may be formed by anisotropically etching a blocking insulating layer, a charge trap layer, and a tunneling layer conformally formed in order on the bottom surface and the sidewalls of the opening H where the control gate patterns 115a are exposed and on the upper surface of the stack S. In the present embodiment, the charge trap layer 126 may be a silicon nitride film as a dielectric film, but is not limited thereto. The blocking insulating layer 123 may be a silicon oxide layer, a silicon oxynitride layer, or an aluminum oxide layer having a high dielectric constant. The tunneling layer 133 may be a silicon oxide layer.

The semiconductor channel layer 135 may be formed on the sidewall of the opening H in which the tunneling layer 133 is formed, wherein the semiconductor channel layer 135 may be formed by anisotropically etching a semiconductor channel layer conformally formed on the sidewall of the opening H having the tunneling layer 133, on the common source line 105, and on the upper surface of the stack S. Here, the semiconductor channel layer 135 may be a polysilicon layer, a poly SiGe layer, or a metal oxide semiconductor layer, but is not limited thereto. In other embodiments, the semiconductor channel layer 135 may be a single crystal semiconductor layer which is epitaxially grown from the semiconductor substrate exposed in the opening H and then anisotropically etched. The common source line 105 may be exposed in the opening H in which the semiconductor channel layer 135 is formed.

Figure 2D:
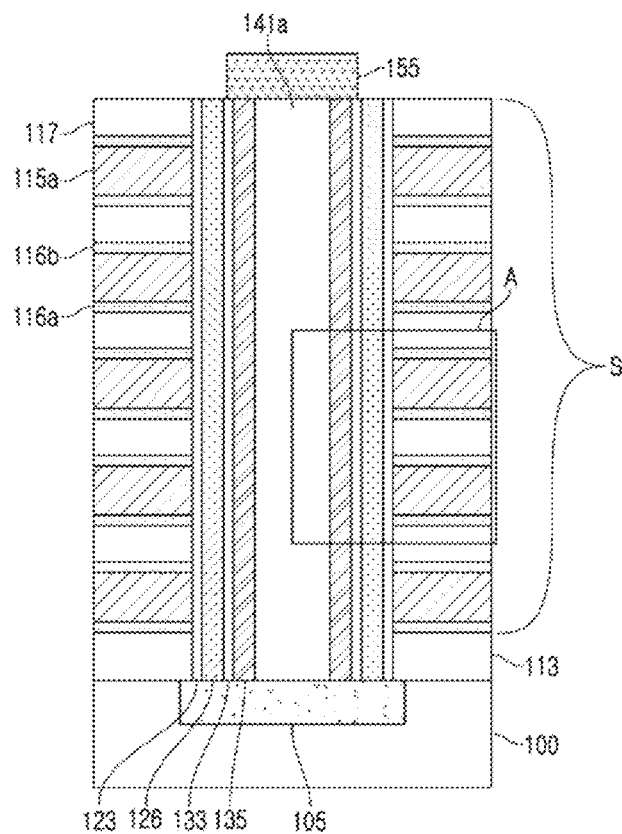

Referring to FIGS. 1 and 2D, the opening H in which the semiconductor channel layer 135 is formed may be filled with a filling insulating film, and the filling insulating film may be planarized by etching to form an insulating pillar 141a, and at the same time, the upper surface of the stack S and an upper end surface of the semiconductor channel layer 135 surrounding the insulating pillar 141a may be exposed. An upper electrode 155 may be formed to cover the insulating pillar 141a and the semiconductor channel layer 135 surrounding the insulating pillar 141a. The upper electrode 155 may be a bit line or a conductive pad connected to the bit line.

Referring back to FIGS. 1 and 2D, the structure of the vertical non-volatile memory device according to the present embodiment will be described. The vertical non-volatile memory device according to the present exemplary embodiment may include an insulating pillar 141a extending in an upper direction of the substrate 100. Inter-cell insulating layers 117 and control gate patterns 151a that are alternately stacked on the side of the insulating pillar 141a may be disposed. An upper spacer insulating film 116b is disposed between the control gate pattern 115a and the inter-cell insulating layer 117 adjacent to the upper portion of the control gate pattern 115a on the side of the insulating pillar 141a. A lower spacer insulating film 116a may be disposed between the control gate pattern 115a and the inter-cell insulating layer 117 adjacent to the lower portion of the control gate pattern 115a on the side of the insulating pillar 141a. The spacer insulating films 116a and 116b may have a lower dielectric constant than the inter-cell insulating layer 117. The semiconductor channel layer 135, the tunneling layer 133, and the charge trap layer 126, and the blocking insulating layer 123 may be sequentially disposed on the insulating pillar 141a and extend along the insulating pillar 141a between the insulating pillar 141a and the control gate patterns 115a. In other words, the semiconductor channel layer 135, the tunneling layer 133, the charge trap layer 126, and the blocking insulating layer 123 may be sequentially wrapped around the sidewall of the insulating pillar 141a.

Figure 3:
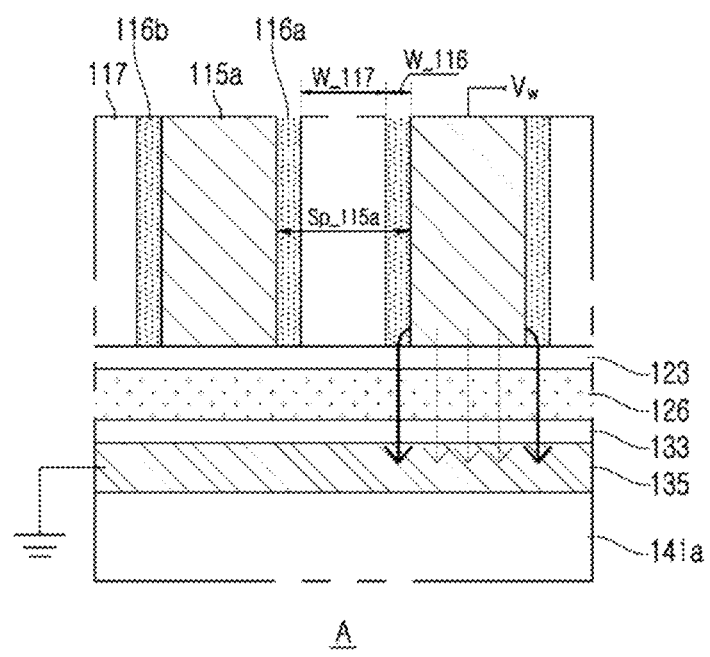
FIG. 3 is a schematic diagram illustrating an example of a process of writing data into a non-volatile memory device described with reference to FIGS. 1 and 2D.

FIG. 3 is a schematic diagram illustrating an example of a process of writing data into a non-volatile memory device described with reference to FIGS. 1 and 2D, and FIG. 3 is an enlarged cross-sectional view illustrating region A of FIG. 2D.

Referring to FIG. 3, when the semiconductor channel layer 135 is grounded and the write voltage Vw is applied to any one of the control gate patterns 115a, an electric field may be formed between the control gate pattern 115a to which the write voltage Vw is applied and the semiconductor channel layers 135. In this case, a fringe electric field may also be formed between the sidewall of the control gate pattern 115a and the semiconductor channel layer 135.

In the present embodiment, the inter-cell insulating layer 117 may be disposed between the control gate patterns 115a and a spacer insulating film 116a or 116b having a lower dielectric constant than the inter-cell insulating layer 117 may be formed between the control gate pattern 115a and the inter-cell insulating layer 117. In other words, as the spacer insulating film 116a or 116b having a low dielectric constant is disposed adjacent to the sidewall of the control gate pattern 115a, the fringe electric field may be concentrated within the spacer insulating film 116a or 116b. As a result, the number of charges transferred from the semiconductor channel layer 135 into the charge trap layer 126 by the electric field increases, leading to more accumulation of charge in the charge trapping layer 126. In this case, the threshold voltage of the unit cell in the state where data is programmed may increase, and therefore, difference in threshold voltage between a programmed and erased state of the unit cell, referred to as threshold voltage window, can increases. This may be advantageous for multi-level cell implementation. In addition, as more charges accumulate in the charge trap layer 126, even if the trapped charges are somewhat lost over time, the probability that charges are lost enough to cause a read error may be reduced, resulting in improved device reliability such as data retention characteristics.

Meanwhile, the width W_116 of the spacer insulating film may be equal to or smaller than the width W_117 of the inter-cell insulating layer. In this case, the width may also be referred to as thickness. Further, the ratio of the width W_116 of the spacer insulating film to the spacing Sp_115a between the control gate patterns 115a may be 0.05 to 0.2, specifically 0.075 to 0.175, more specifically 0.1 to 0.15, for example, 0.125. The width W_116 of the spacer insulating film may be 2 to 8 nm, specifically 3 to 7 nm, more specifically 4 to 6 nm, for example 5 nm.

Figure 4:
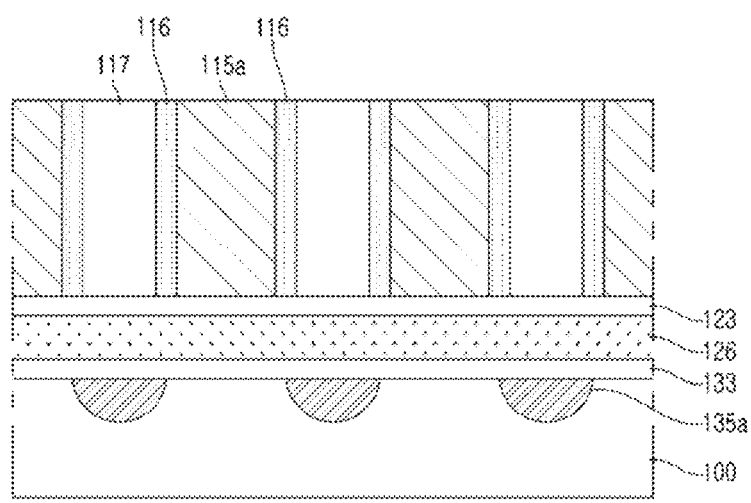
FIG. 4 is a cross-sectional view illustrating a planar non-volatile memory device according to another exemplary embodiment of the present invention.

FIG. 4 is a cross-sectional view illustrating a planar non-volatile memory device according to another exemplary embodiment of the present invention. The device according to the present exemplary embodiment may be similar to the device described with reference to FIGS. 1 and 2A to 2D except as described below.

Referring to FIG. 4, the substrate 100 may be a semiconductor substrate, and source/drain regions 135a may be formed in the substrate 100. When the substrate 100I is a p-type semiconductor substrate, the source/drain regions 135a may be formed by ion implantation of n-type impurities. A channel may be formed adjacent to the surface of the substrate 100 between the source/drain regions 135a during the device operation, and thus the region between the source/drain regions 135a adjacent to the surface of the substrate 100 may be defined as a channel region. Accordingly, the source/drain regions 135a and the channel region therebetween may be referred to as a semiconductor channel layer. In another example, unlike the illustrated example, a separate semiconductor channel layer may be formed on the substrate 100, for example, a polysilicon layer, a poly SiGe layer, or a metal oxide semiconductor layer.

The tunneling layer 133, the charge trap layer 126, and the blocking insulating layer 123 may be sequentially formed on the substrate 100. A plurality of control gate patterns 115a may be formed on the blocking insulating layer 123. A spacer insulating film 116 having a spacer shape may be formed on both sidewalls of each of the control gate patterns 15a by anisotropic etching an insulating layer formed on the control gate patterns 115a. An inter-cell insulating layer 117 may be formed on the substrate on which the spacer insulating film 116 is formed. The spacer insulating film 116 may be an insulating film having a lower dielectric constant than the inter-cell insulating layer 117. The spacer insulating film 116 may be a low-k dielectric film having a lower dielectric constant than the silicon oxide layer ($SiO_2$).

Figure 5:
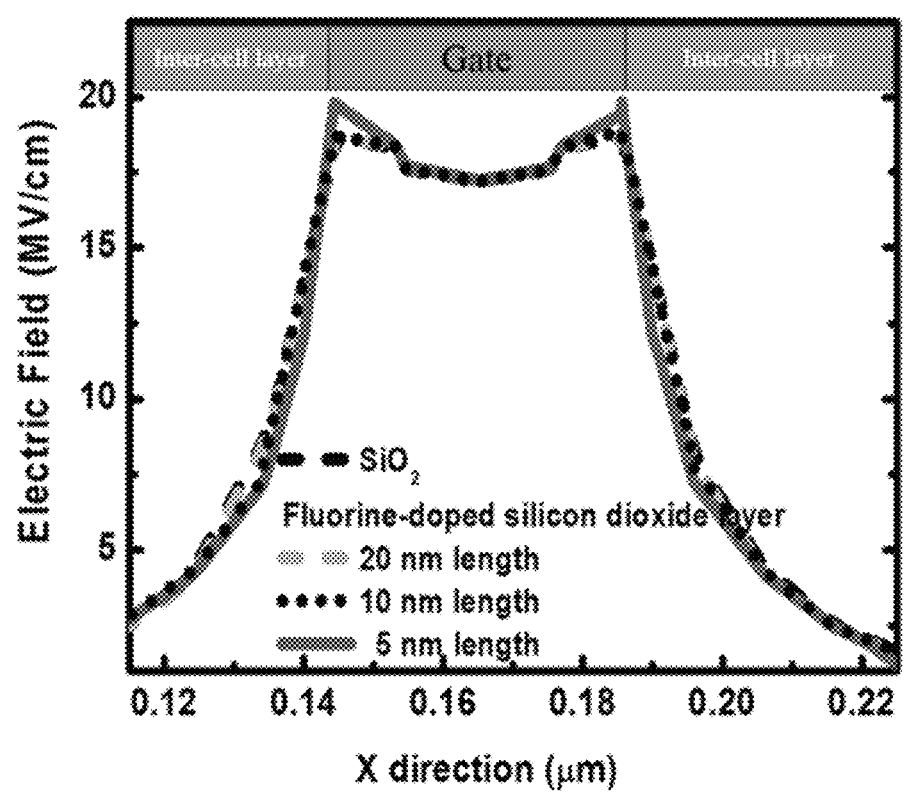
FIG. 5 is a graph illustrating an electric field around a control gate electrode when a voltage is applied to the control gate electrode of the non-volatile memory device according to an exemplary embodiment of the present invention.
Figure 6:
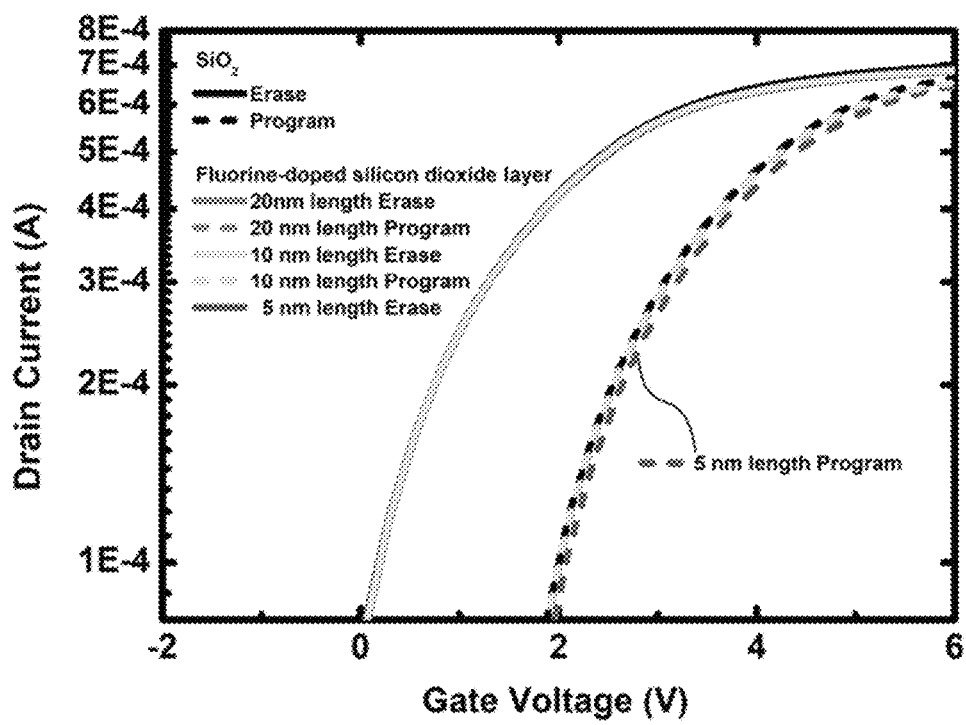
FIG. 6 is an Id-Vg graph when data is programmed and erased in a unit cell of a non-volatile memory device according to an embodiment of the present invention.
Figure 7:
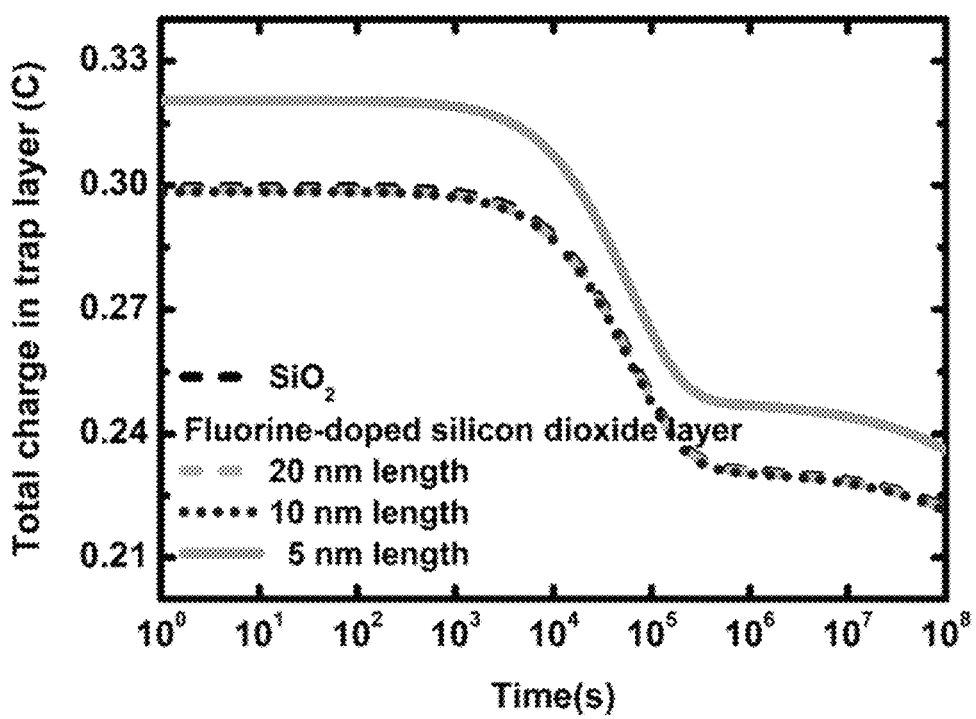
FIG. 7 is a graph illustrating a change in total charge in a charge trap layer over time after programming a unit cell of a non-volatile memory device according to an exemplary embodiment of the present invention.

FIG. 5 is a graph illustrating an electric field around a control gate electrode when a voltage is applied to the control gate electrode of the non-volatile memory device according to an exemplary embodiment of the present invention. FIG. 6 is an Id-Vg graph when data is programmed and erased in a unit cell of a non-volatile memory device according to an embodiment of the present invention. FIG. 7 is a graph illustrating a change in total charge in a charge trap layer over time after programming a unit cell of a non-volatile memory device according to an exemplary embodiment of the present invention.

Graphs of FIGS. 5, 6, and 7 are simulation results for four devices in which width of a control gate electrode is 40 nm, the spacing between the control gate electrodes is also 40 nm. The first device denoted as "5 nm length" has a fluorine-doped silicon oxide layer which is a spacer insulating film having a thickness (W_116 of FIG. 3) of 5 nm on both sidewalls of the control gate electrodes, and the remaining regions having width of 30 nm between the control gate electrodes is filled with $SiO_2$; the second device denoted as "10 nm length" has a fluorine-doped silicon oxide layer which is a spacer insulating film having a thickness (W_116 of FIG. 3) of 10 nm on both sidewalls of the control gate electrodes, and the remaining regions having width of 20 nm between the control gate electrodes is filled with $SiO_2$; the third device denoted as "20 nm length" has a fluorine-doped silicon oxide layer which is a spacer insulating film having a thickness (W_116 of FIG. 3) of 20 nm on both sidewalls of the control gate electrodes, and no remaining regions between the control gate electrodes; the fourth device denoted as "$SiO_2$" has only $SiO_2$ filling between the control gate electrodes.

Referring to FIG. 5, in the case of the device denoted as "5 nm length", the degree of electric field concentration in the region adjacent to the sidewalls of control gate electrode is higher than those in other cases.

Referring to FIG. 6, in the case of the device denoted as "5 nm length", the threshold voltage in the programmed state is higher than those in the other cases while the threshold voltage in the erased state is not different from the other cases, thereby implementing the largest threshold voltage window.

Referring to FIG. 7, in the case of the device denoted as "5 nm length", the amount of charge trapped in the charge trap layer is higher than those of the other cases, and the remaining charge amount is much higher even when 108 seconds have elapsed.

Figure 8A:
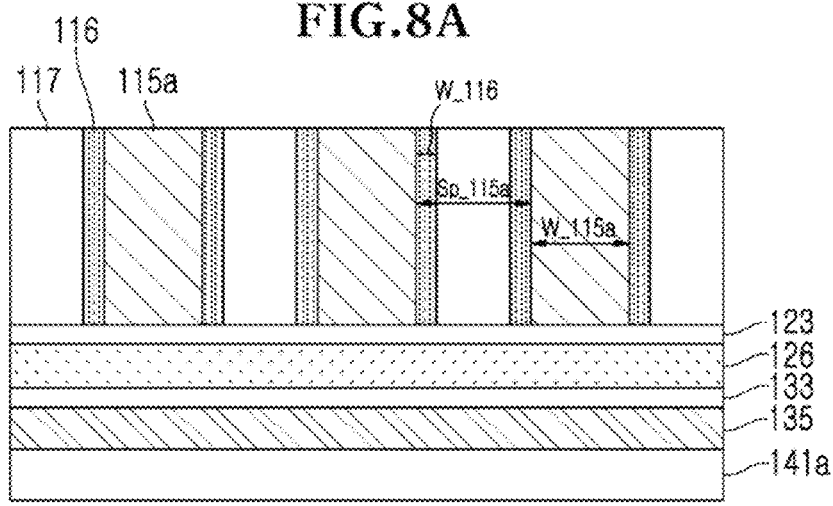
FIG. 8A is a cross sectional view of a non-volatile memory device according to an exemplary embodiment of the present invention.
Figure 8B:
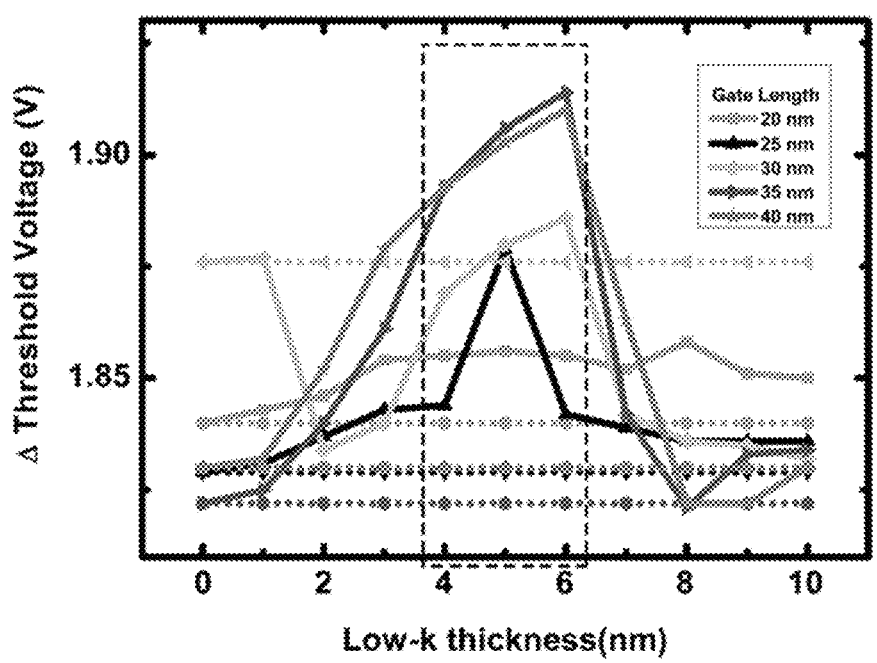
FIG. 8B is a graph illustrating a program/erase threshold voltage difference depending on a width of a spacer insulating film in a non-volatile memory device according to FIG. 8A.
Figure 9A:
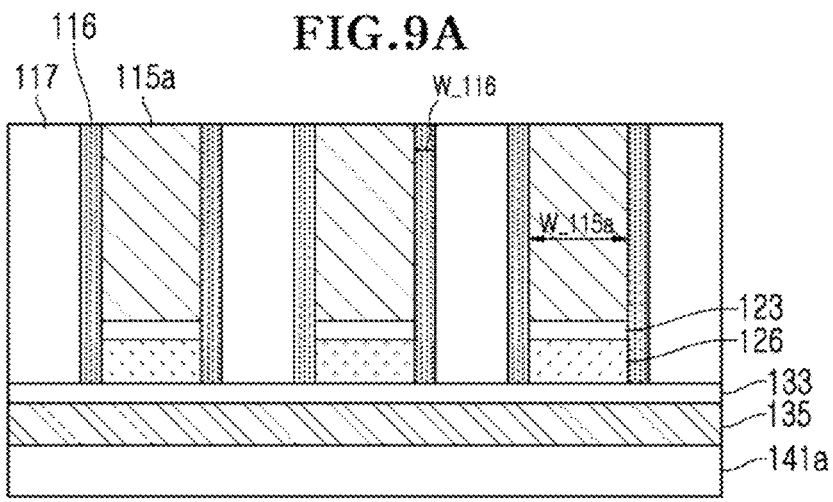
FIG. 9A is a cross sectional view of a non-volatile memory device according to a comparative example.
Figure 9B:
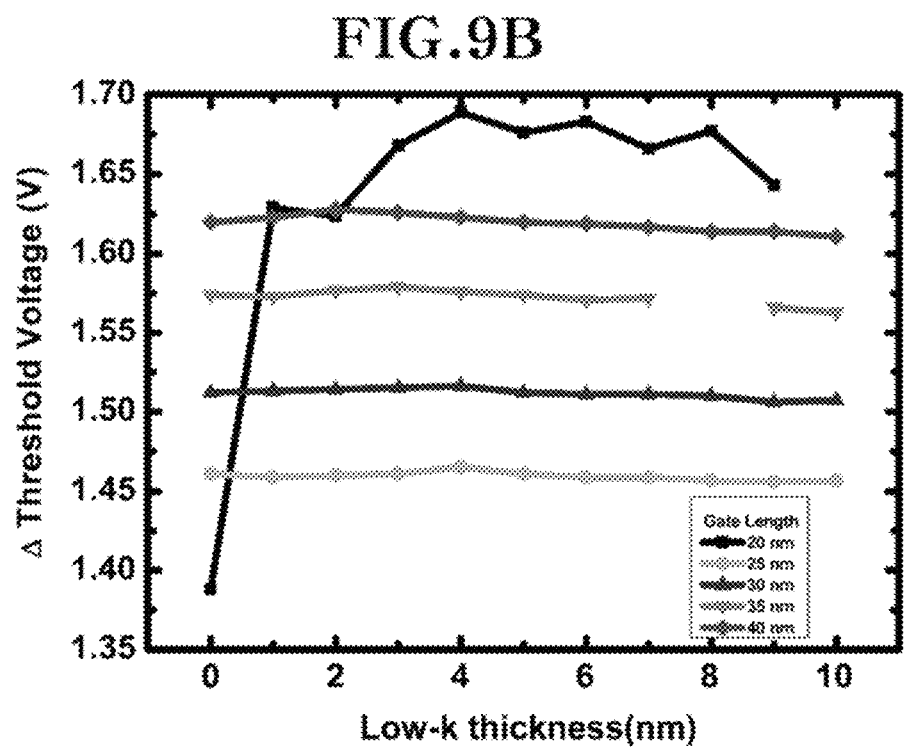
FIG. 9B is a graph illustrating a program/erase threshold voltage difference depending on a width of a spacer insulating film in a non-volatile memory device according to FIG. 9A.

FIG. 8A is a cross sectional view of a non-volatile memory device according to an exemplary embodiment of the present invention. The device according to the present exemplary embodiment may be substantially the same as the device described with reference to FIGS. 1 and 2A to 2D except as described below. FIG. 8B is a graph illustrating a program/erase threshold voltage difference depending on a width of a spacer insulating film in a non-volatile memory device according to FIG. 8A. FIG. 9A is a cross sectional view of a non-volatile memory device according to a comparative example. FIG. 9B is a graph illustrating a program/erase threshold voltage difference depending on a width of a spacer insulating film in a non-volatile memory device according to FIG. 9A.

Graphs of FIGS. 8B and 9B are, respectively, simulation results of the devices of FIGS. 8A and 9A in which the width W_115a of the control gate electrode denoted as "Gate Length" is 20 nm, 25 nm, 30 nm, 35 nm, or 40 nm, and the spacing Sp_115a between the control gate electrodes is equal to the width W_115a of the control gate electrode, and a fluorine-doped silicon oxide film 116 having a width W_116 denoted as "low-k thickness" between 1 nm and 10 nm is positioned on the sidewall of the control gate electrode 115a and remaining region between the control gate electrodes 115a is filled with $SiO_2$ (low-k thickness=1 nm, 2 nm, 3 nm, 4 nm, 5 nm, 6 nm, 7 nm, 8 nm, 9 nm, and 10 nm). Low-k thickness of 0 nm means the region between the control gate electrodes 115a is filled with $SiO_2$ without the fluorine-doped silicon oxide film 116.

Referring to FIGS. 8A and 8B, in the non-volatile memory device according to the present exemplary embodiment, the charge trap layer 126 extends under the plurality of control gate electrodes 115a, in other words, the charge trap layer 126 is formed under the region between the control gate electrodes 115a or the charge trap layer 126 is formed under the spacer insulating film 116 and the inter-cell insulating layer 117. Therefore, the spacer insulating film 116 is positioned only on the sidewalls of the control gate electrode 115a. In such a device, it can be seen that the program/erase threshold voltage difference, that is, the threshold window, increases, when the width W_116 of the spacer insulating film denoted as "low-k thickness" in FIG. 8B is 2 to 8 nm, specifically 3 to 7 nm, more specifically 4 to 6 nm.

Referring to FIGS. 9A and 9B, in the non-volatile memory device according to the comparative example, a charge trap layer 126 is formed only under each control gate electrode 115a, in other words, the charge trap layer 126 is not formed under the region between the control gate electrodes 115a. Therefore, the spacer insulating film 116 is formed on the sidewalls of the charge trap layer 126 as well as the control gate electrode 115a. In such a device, it can be seen that there is almost no change in the program/erase threshold voltage due to the change in the thickness W_116 of the spacer insulating film 116 denoted as "low-k thickness". This is because the charge trap layer 126 has the same width as the control gate electrode 115a, so that an electric field concentrated in the spacer insulating film 116 adjacent to the sidewall of the control gate electrode 115a during the programming process does not significantly affect the charge accumulation into the charge trap layer 126.

According to embodiments of the present invention, a large amount of charge may be accumulated in the charge trapping layer during a program operation of a nonvolatile memory device, and thus, there is an increase in threshold voltage window during a program/erase operation and data retention characteristics may be improved, which is advantageous for implementing high capacity in a non-volatile memory device.

While the exemplary embodiments of the present invention have been described above, those of ordinary skill in the art should understood that various changes, substitutions and alterations may be made herein without departing from the spirit and scope of the present invention as defined by the following claims.

What is claimed is:
1. Non-volatile memory device comprising:
a semiconductor channel layer, a tunneling layer, a charge trap layer, and a blocking insulating layer arranged in sequence;

a plurality of control gate electrodes disposed on the blocking insulating layer;
an inter-cell insulating layer disposed between the control gate electrodes; and
a spacer insulating film disposed between the control gate electrode and the inter-cell insulating layer, the spacer insulating film having a lower dielectric constant than the inter-cell insulating layer,
wherein the charge trap layer extends under the plurality of control gate electrodes, and the charge trap layer is disposed under the inter-cell insulating layer and the spacer insulating film.

2. The non-volatile memory device of claim 1, wherein the inter-cell insulating layer is a silicon oxide layer.

3. The non-volatile memory device of claim 1, wherein the spacer insulating film is a silicon oxide-based low-k insulating film, an organic polymer film, or a silicone based polymeric layer.

4. The non-volatile memory device of claim 3, wherein the silicon oxide-based low-k insulating film is a fluorine-doped silicon oxide layer, a carbon-doped silicon oxide layer, a porous silicon oxide layer, or a porous carbon-doped silicon oxide layer.

5. The non-volatile memory device of claim 3, wherein the organic polymer film is polyimides, polynorbornenes, benzocyclobutene polymer, or PTFE (polytetrafluoroethylene).

6. The non-volatile memory device of claim 3, wherein the silicone based polymeric layer is HSQ(hydrogen silsesquioxane) or MSQ(methyl silsesquioxane).

7. The non-volatile memory device of claim 1, wherein the width of the spacer insulating film is smaller than the width of the inter-cell insulating layer.

8. The non-volatile memory device of claim 1, wherein a ratio of a width of the spacer insulating film to a spacing between the control gate patterns is 0.05 to 0.2.

9. The non-volatile memory device of claim 1, wherein a ratio of a width of the spacer insulating film to a spacing between the control gate patterns is 0.1 to 0.15.

10. The non-volatile memory device of claim 1, wherein the spacer insulating film has a width of 2 to 8 nm.

11. The non-volatile memory device of claim 1, wherein the spacer insulating film has a width of 4 to 6 nm.

* * * * *